(12) United States Patent
Tanaka et al.

(10) Patent No.: US 9,925,754 B2
(45) Date of Patent: Mar. 27, 2018

(54) METHOD FOR MANUFACTURING FLEXIBLE DEVICE

(71) Applicant: PANASONIC CORPORATION, Osaka (JP)

(72) Inventors: Yuji Tanaka, Osaka (JP); Kenji Okumoto, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 399 days.

(21) Appl. No.: 13/952,706

(22) Filed: Jul. 29, 2013

(65) Prior Publication Data

US 2013/0306231 A1 Nov. 21, 2013

Related U.S. Application Data

(63) Continuation of application No. PCT/JP2012/004700, filed on Jul. 24, 2012.

(30) Foreign Application Priority Data

Aug. 5, 2011 (JP) .................................. 2011-171526

(51) Int. Cl.
| | | |
|---|---|---|
| *B32B 38/10* | (2006.01) | |
| *G02F 1/1333* | (2006.01) | |
| *H01L 21/683* | (2006.01) | |

(52) U.S. Cl.
CPC ........ *B32B 38/10* (2013.01); *G02F 1/133305* (2013.01); *G02F 2202/28* (2013.01); *H01L 21/6835* (2013.01)

(58) Field of Classification Search
CPC ................. H05K 1/0393; H05K 3/386; B32B 2307/748; B32B 2457/20; B32B 7/06;
(Continued)

(56) References Cited

U.S. PATENT DOCUMENTS

| | | |
|---|---|---|
| 5,443,922 A | 8/1995 | Nishizaki et al. |
| 2003/0029556 A1* | 2/2003 | Tsukagoshi ......... H01L 21/6835 156/247 |

(Continued)

FOREIGN PATENT DOCUMENTS

| | | |
|---|---|---|
| JP | 5-163488 | 6/1993 |
| JP | 2001-290138 | 10/2001 |

(Continued)

OTHER PUBLICATIONS

U.S. Appl. No. 13/983,169 to Takashi Osako et al., filed Aug. 1, 2013.

(Continued)

*Primary Examiner* — Scott W Dodds
(74) *Attorney, Agent, or Firm* — Greenblum & Bernstein, P.L.C.

(57) ABSTRACT

A manufacturing method of a flexible device comprises: an adjustment step of adjusting adhesive characteristics of an adhesive layer formed over a supporting substrate; a temporary bonding step of temporarily bonding the flexible substrate; an electronic device formation step of forming an electronic device; and a separation step of separating the flexible substrate. In the adjustment step, the adhesive characteristics of the adhesive layer are adjusted to satisfy a relationship of $P_B < P_A$, where $P_A$ denotes a peel strength of the adhesive layer after the electronic device formation step, in a case where the adhesive layer undergoes the electronic device formation step without undergoing the adjustment step, and $P_B$ denotes a peel strength of the adhesive layer after the electronic device formation step, in a case where the adhesive layer undergoes the electronic device formation step after undergoing the adjustment step.

10 Claims, 4 Drawing Sheets

Adhesive layer formation step

Adhesive characteristics adjustment step

Heat or UV irradiation

(58) Field of Classification Search
CPC ............. B32B 38/10; H01L 2251/5338; H01L 21/6835; G02F 1/133305; G02F 2202/28
USPC ................................. 156/247, 322; 428/41.8
See application file for complete search history.

(56) References Cited

U.S. PATENT DOCUMENTS

| | | |
|---|---|---|
| 2005/0230050 A1* | 10/2005 | Nogiwa et al. ............... 156/350 |
| 2010/0038023 A1 | 2/2010 | Kho et al. |
| 2010/0059171 A1 | 3/2010 | Chun |
| 2011/0094675 A1 | 4/2011 | Sato et al. |
| 2012/0156457 A1 | 6/2012 | Kondo |
| 2013/0095592 A1 | 4/2013 | Koresawa et al. |

FOREIGN PATENT DOCUMENTS

| | | |
|---|---|---|
| JP | 2005-100895 | 4/2005 |
| JP | 2009-523883 | 6/2009 |
| JP | 2009-530470 | 8/2009 |
| JP | 2010-039472 | 2/2010 |
| WO | 2011/024690 A1 | 3/2011 |

OTHER PUBLICATIONS

International Search Report for PCT/JP2012/004700 dated Oct. 16, 2012.
Office Action issued in Japan Family member Patent Appl. No. 2013-527857, dated Oct. 20, 2015.

\* cited by examiner

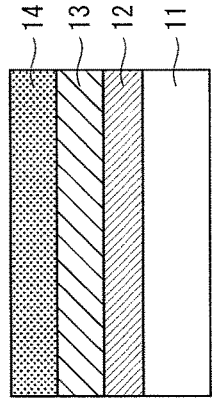
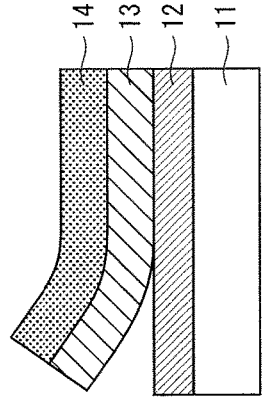
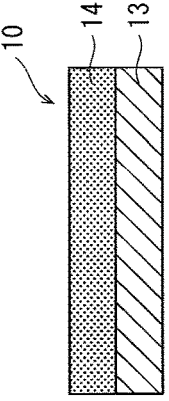
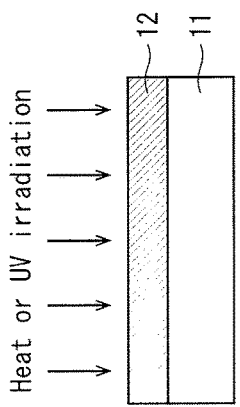
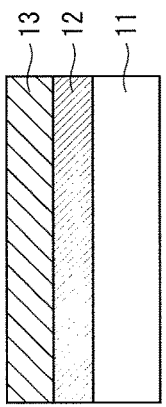
FIG. 1A Adhesive layer formation step
FIG. 1B Adhesive characteristics adjustment step
FIG. 1C Temporary bonding step
FIG. 1D Electronic device formation step
FIG. 1E Separation step
FIG. 1F Completed

FIG. 2

| entry | Heating condition | | Peel strength | |
|---|---|---|---|---|
| | Heating temperature [°C] | Heating duration [hr] | After heating process (X) | After heating step (210 °C, 8 hrs) (Y) |
| 1 | — | — | 46 | 100 |
| 2 | 200 | 1 | 8 | 77 |
| 3 | 230 | 1 | 6 | 61.5 |
| 4 | 250 | 1 | 5 | 46 |
| 5 | 280 | 1 | 1.5 | 11.5 |
| 6 | 280 | 3 | 1.5 | 11.5 |

FIG. 4

| entry | UV irradiation condition | | Peel strength | |
|---|---|---|---|---|
| | Light source used (Wavelength) | Irradiation duration [sec] | After UV irradiation process (X) | After heating step (210 °C, 8 hrs) (Y) |
| 1 | — | — | 46 | 100 |
| 2 | Excimer UV (172nm) | 1.0 | 5.4 | 12 |
| 3 | High pressure mercury lamp UV (254, 365nm) | 600 | 6.2 | 16 |

METHOD FOR MANUFACTURING FLEXIBLE DEVICE

CROSS REFERENCE TO RELATED APPLICATION

This is a continuation application of PCT Application No. PCT/JP2012/004700 filed Jul. 24, 2012, designating the United States of America, the disclosure of which, including the specification, drawings and claims, is incorporated herein by reference in its entirety.

TECHNICAL FIELD

The present disclosure relates to a manufacturing method of a flexible device.

DESCRIPTION OF THE RELATED ART

Along with the spread of portable information terminals, etc., there is a strong demand for displays provided for these terminals to be thin and lightweight. In addition to such a demand, there is a growing need for a display having excellent shock resistance and flexibility as well. In response to such demands, it has been considered to form a display with use of a flexible substrate, instead of an existing glass substrate.

However, use of a flexible substrate has the following problem. In the case of forming an electronic device on a flexible substrate, it is beneficial that the flexible substrate, which serves as a base material, be flat. However, ensuring flatness of the flexible substrate is difficult since the flexible substrate is easily deformed and warped. Accordingly, when the electronic device is to be formed on the flexible substrate, an adhesive layer is formed on a supporting substrate, and the flexible substrate is temporarily bonded to the supporting substrate with the adhesive layer therebetween so as to ensure flatness of the flexible substrate (e.g., Patent Literatures 1 and 2). This adhesive layer can be formed with a silicone adhesive, for example, as disclosed in Patent Literature 1. When formation of the electronic device on the flexible substrate is completed, the flexible substrate is separated from the supporting substrate.

CITATION LIST

[Patent Literature]

[Patent Literature 1]
Japanese Patent Application Publication No. 2009-523883
[Patent Literature 2]
Japanese Patent Application Publication No. 2005-100895

SUMMARY

In the manufacturing of a flexible device, it is desirable that the peel strength of the adhesive layer after an electronic device formation step is not excessively increased as compared to before the electronic device formation step. If the peel strength is excessively increased, a problem may arise, such as that the flexible substrate is damaged when the flexible substrate is separated from the supporting substrate, or that the flexible substrate cannot be separated from the supporting substrate.

In view of the above problem, one non-limiting and exemplary embodiment provides a manufacturing method of a flexible device that prevents an excessive increase in the peel strength of an adhesive layer as a result of the adhesive layer having undergone an electronic device formation step.

In one general aspect, the techniques disclosed here feature a manufacturing method of a flexible device, comprising: an adhesive layer formation step of forming an adhesive layer over at least one of a flexible substrate and a supporting substrate; an adjustment step of, subsequent to the adhesive layer formation step, adjusting adhesive characteristics of the adhesive layer; a temporary bonding step of, subsequent to the adjustment step, temporarily bonding the supporting substrate and the flexible substrate with the adhesive layer therebetween; an electronic device formation step of, subsequent to the temporary bonding step, forming one or more electronic devices over a surface of the flexible substrate opposite a surface thereof that faces the adhesive layer; and a separation step of, subsequent to the electronic device formation step, separating the flexible substrate from the supporting substrate, wherein in the adjustment step, the adhesive characteristics of the adhesive layer are adjusted to satisfy a relationship of $P_B < P_A$, where $P_A$ denotes a peel strength of the adhesive layer during a period after the electronic device formation step and before the separation step, in a case where the adhesive layer undergoes the electronic device formation step without undergoing the adjustment step, and $P_B$ denotes a peel strength of the adhesive layer during the period after the electronic device formation step and before the separation step, in a case where the adhesive layer undergoes the electronic device formation step after undergoing the adjustment step.

According to one aspect of the present disclosure, the manufacturing method of a flexible device includes the adjustment step prior to the temporary bonding step. In the adjustment step, the adhesive characteristics of the adhesive layer are adjusted to satisfy the relationship of $P_B < P_A$ above, in consideration for an increase in the peel strength of the adhesive layer caused by the electronic device formation step. As a result, the peel strength of the adhesive layer after the electronic device formation step is decreased as compared to the case of not including the adjustment step.

Therefore, according to one aspect of the present disclosure, the peel strength of the adhesive layer is prevented from being excessively increased as a result of the adhesive layer undergoing the electronic device formation step.

These general and specific aspects may be implemented using a device.

Additional benefits and advantages of the disclosed embodiments will be apparent from the specification and figures. The benefits and/or advantages may be individually provided by the various embodiments and features of the specification and drawings disclosed, and need not all be provided in order to obtain one or more of the same.

BRIEF DESCRIPTION OF DRAWINGS

FIGS. 1A to 1F are each a schematic diagram showing a manufacturing method of a flexible device according to an embodiment.

FIG. 2 is a table showing (i) a heating condition during an adhesive characteristics adjustment step and (ii) the peel strength of an adhesive layer at a predetermined time point.

FIG. 4 is a table showing (i) a UV irradiation condition during the adhesive characteristics adjustment step and (ii) the peel strength of the adhesive layer at a predetermined time point.

DETAILED DESCRIPTION

Figure 3A:
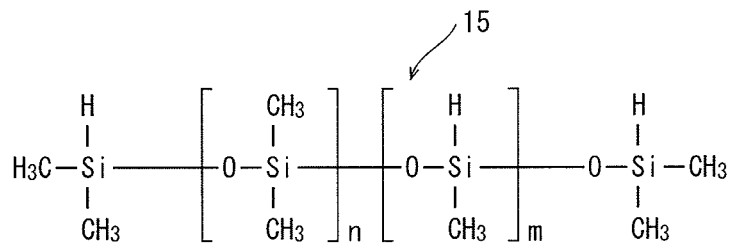
FIG. 3A shows the structure of an Si—H group-containing silicone 15.

<<Outline of an Aspect of the Present Disclosure>>

One aspect of the present disclosure is directed to a manufacturing method of a flexible device, comprising: an adhesive layer formation step of forming an adhesive layer over at least one of a flexible substrate and a supporting substrate; an adjustment step of, subsequent to the adhesive layer formation step, adjusting adhesive characteristics of the adhesive layer; a temporary bonding step of, subsequent to the adjustment step, temporarily bonding the supporting substrate and the flexible substrate with the adhesive layer therebetween; an electronic device formation step of, subsequent to the temporary bonding step, forming one or more electronic devices over a surface of the flexible substrate opposite a surface thereof that faces the adhesive layer; and a separation step of, subsequent to the electronic device formation step, separating the flexible substrate from the supporting substrate, wherein in the adjustment step, the adhesive characteristics of the adhesive layer are adjusted to satisfy a relationship of $P_B < P_A$, where $P_A$ denotes a peel strength of the adhesive layer during a period after the electronic device formation step and before the separation step, in a case where the adhesive layer undergoes the electronic device formation step without undergoing the adjustment step, and $P_B$ denotes a peel strength of the adhesive layer during the period after the electronic device formation step and before the separation step, in a case where the adhesive layer undergoes the electronic device formation step after undergoing the adjustment step.

In the manufacturing method, the adhesive layer may be formed over the supporting substrate.

In the manufacturing method, the adjustment step may include a step of heating the adhesive layer.

In the step of heating the adhesive layer in the manufacturing method, the adhesive layer may be heated at a temperature of 200° C. to 300° C.

In the step of heating the adhesive layer in the manufacturing method, the adhesive layer may be heated for one hour to three hours.

In the manufacturing method, the adjustment step may include a step of irradiating the adhesive layer with ultraviolet rays.

In the manufacturing method, a wavelength of the ultraviolet rays used in the adjustment step may be 150 nm to 380 nm.

In the manufacturing method, the adhesive layer may include a silicone adhesive.

In the manufacturing method, the silicone adhesive may have a vinyl group.

In the manufacturing method, the electronic device formation step may include a step in which the adhesive layer is subjected to heat.

In the manufacturing method, during heating in the electronic device formation step, a heating temperature may be 200° C. to 280° C., and a total heating duration may be one hour to fifteen hours.

In the manufacturing method, the electronic devices may include at least one of an organic thin film transistor and an OLED device.

The manufacturing method may further comprise a removal step of, subsequent to the separation step, removing a remnant of the adhesive layer formed over the supporting substrate.

EMBODIMENT

[Overview]

FIG. 1 is a schematic diagram showing a manufacturing method of a flexible device according to the present embodiment.

The manufacturing method of a flexible device according to the present embodiment comprises: an adhesive layer formation step; an adhesive characteristics adjustment step; a temporary bonding step; an electronic device formation step; and a separation step. First, a description is provided of an overview of the manufacturing method of a flexible device with reference to FIG. 1. Then, a detailed description is provided of the adhesive characteristics adjustment step, which is a feature of the present embodiment.

As shown in FIG. 1A, in the adhesive layer formation step, an adhesive layer 12 is formed over (i.e., on or above) the upper surface of a supporting substrate 11 which supports a flexible substrate. The supporting substrate 11 is used for the purpose of ensuring the flatness of the flexible substrate during the electronic device formation step. Accordingly, it is desirable that the supporting substrate 11 is formed with a material that has a high degree of flatness and that is resistant to deformation. Examples of such a material for the supporting substrate 11 include insulating materials such as alkali-free glass, soda glass, nonfluorescent glass, phosphate glass, borate glass, quartz, acrylic resin, styrenic resin, polycarbonate resin, epoxy resin, polyethylene, polyester, silicone resin, and alumina.

The adhesive layer 12 is desirably formed with an adhesive that is excellent in heat resistance, chemical resistance, and releasability. For example, the adhesive layer 12 can be formed with a silicone adhesive.

In the adhesive characteristics adjustment step (see FIG. 1B) subsequent to the adhesive layer formation step, the adhesive characteristics of the adhesive layer 12, which has been formed in the adhesive layer formation step, are adjusted. The adhesive characteristics adjustment step is provided for the purpose of preventing an excessive increase in the peel strength of the adhesive layer 12 as a result of the adhesive layer 12 undergoing the electronic device formation step. Specifically, as shown in FIG. 1B, the adhesive layer 12 is subjected to a heating process or ultraviolet (UV) irradiation process. Conditions of the heating process and the UV irradiation process are described below.

In the temporary bonding step (see FIG. 1C), a flexible substrate 13 is temporarily bonded to the supporting substrate 11 with the adhesive layer 12 therebetween which has undergone the adhesive characteristics adjustment step (see FIG. 1B). This ensures the flatness of the flexible substrate 13, whereby a film or the like can be formed evenly over the flexible substrate 13, similarly to the case of using an existing glass substrate.

The flexible substrate 13 is a film formed with, for example, polyimide, polyester, polytetrafluoroethylene, polyphenylene sulfide, polyamide, polyamide-imide, polycarbonate, polystyrene, polypropylene, polyethylene, polyvinyl chloride, polyethersulfone, polyethylene naphthalene, polyolefin such as ethylene-propylene copolymer or ethylene-vinyl acetate copolymer, cyclic polyolefin, modified polyolefin, polyvinylidene chloride, acrylic resin, polymethyl methacrylate, acrylic styrene copolymer, butadiene styrene copolymer, ethylene vinyl alcohol copolymer, polyether, polyether ketone, polyether ether ketone, polyetherimide, polyacetal, polyphenylene oxide, modified polyphenylene oxide, polyarylate, aromatic polyester, or polyvinylidene fluoride. The flexible substrate 13 may be a film formed with one of the aforementioned materials or, alternatively, a multilayer lamination film formed with at least two of the aforementioned materials.

In the electronic device formation step shown in FIG. 1D, an electronic device layer 14 is formed over a surface of the flexible substrate 13 that has undergone the temporary bonding step. Specifically, the electronic device layer 14 is formed over a surface of the flexible substrate 13 opposite a surface thereof which faces the adhesive layer 12 (i.e., upper surface of the flexible substrate 13 in the present embodiment). An OLED device and an organic TFT (organic thin film transistor) for driving the OLED device are formed in the electronic device layer 14 according to the present embodiment. In other words, the electronic device formation step includes an organic TFT formation step and an OLED device formation step.

The organic TFT formation step includes: a gate electrode formation step; a gate insulation layer formation step; a source electrode and drain electrode formation step; and a semiconductor layer formation step.

A gate electrode is formed as follows. First, a metal material film is formed with use of a vacuum deposition method or a sputtering method. Then, part of the metal material film is selectively removed by etching or the like. Examples of a metal material used to form the gate electrode include silver, aluminum, an alloy of silver, palladium and copper, and an alloy of silver, rubidium and gold.

A gate insulation layer can be obtained, for example, by forming a film with a well-known gate insulation material, such as silicon oxide, by a sputtering method. Note that either an organic polymeric material or an inorganic material may be used as the well-known gate insulation material.

A source electrode and a drain electrode are formed in a similar manner as the gate electrode. That is, a metal material film is formed with use of a vacuum deposition method or a sputtering method, and part of the metal material film is selectively removed by etching or the like. Examples of a metal material used to form the source electrode and the drain electrode include gold, silver, copper, an alloy of silver, palladium and copper, tungsten, and molybdenum.

A semiconductor layer is obtained by forming a film with ink by a well-known application method, such as an inkjet method or a spin coat method. The ink includes an organic semiconductor material and solvent. Examples of the organic semiconductor material include oligomers of low molecular weight materials suitable for application, such as acene derivatives, porphyrin, phthalocyanine derivatives, and polymeric materials such as thiophenes and fluorenes.

The OLED device formation step includes: an anode formation step; an organic light-emitting layer formation step; and a cathode formation step.

An anode is formed by forming a metal material film with use of a vacuum deposition method or a sputtering method, and selectively removing part of the metal material film by etching or the like. Examples of a metal material used to form the anode include the materials for the gate electrode listed above.

An organic light-emitting layer is obtained by forming a film with ink over the anode by a vacuum deposition method or an inkjet method. The ink includes an organic material constituting the organic light-emitting layer, and solvent. Examples of an organic material constituting the organic light-emitting layer include well-known materials listed in Japanese Patent Application Publication No. H5-163488, such as an oxinoid compound, a perylene compound, a coumarin compound, and an azacoumarin compound.

A cathode is obtained by forming a film with a transparent conductive material over the organic light-emitting layer by a sputtering method. Examples of a transparent conductive material used to form the cathode include ITO (indium tin oxide) and IZO (indium zinc oxide).

In the steps of forming: the gate electrode; the gate insulation layer; the source and drain electrodes; the anode; and the cathode, a structure composed of the supporting substrate 11, the adhesive layer 12, and the flexible substrate 13 is placed inside a chamber, and the chamber is heated to a high temperature. In each of the steps of forming the semiconductor layer and the organic light-emitting layer, the aforementioned structure is heated by a hot plate, etc., in order to evaporate the solvent in the ink. This means that in each of the steps of forming the aforementioned elements, the adhesive layer 12 is subjected to heat. Particularly in the step of forming the semiconductor layer, the adhesive layer 12 is heated over a long period of time due to baking performed to crystallize the organic semiconductor material.

Furthermore, the OLED device may further include, as necessary, a hole injection layer, a hole transport layer, an electron transport layer, and an electron injection layer, etc., and each of the steps of forming these layers includes a heating step. In the heating step included in each of the OLED device formation step and the organic TFT formation step, the total heating duration reaches 1 hour to 15 hours, and the heating temperature is 200° C. to 280° C.

In the subsequent separation step, the flexible substrate 13 over which the electronic device layer 14 has been formed is separated from the supporting substrate 11 (see FIG. 1E). By the flexible substrate 13 being separated from the supporting substrate 11 as described above, a flexible device 10 is completed (FIG. 1F).

Note that the separation step shown in FIG. 1E is followed by an adhesive layer removal step. This removal step is a step of removing a remnant of the adhesive layer 12 formed over the supporting substrate 11, after the flexible substrate 13 is separated from the supporting substrate 11. With this removal step, the remnant of the adhesive layer 12 is removed from the supporting substrate 11, and the supporting substrate 11 is thereby returned to the state before formation of the adhesive layer 12. This makes it possible to reuse the supporting substrate 11.

[Adhesive Characteristics Adjustment Step]

The peel strength of the adhesive layer 12, which is made of the silicone adhesive, can be reduced by curing a surface of the adhesive layer 12 before adhesion (before temporary bonding). Methods for curing the adhesive layer 12 include (i) heating the adhesive layer 12 (heating process) and (ii) irradiating a surface of the adhesive layer 12 with ultraviolet rays (UV irradiation process). The present inventors found that subjecting the adhesive layer 12 to the heating process or the UV irradiation process under a predetermined condition can suppress an increase in the peel strength of the adhesive layer 12 even after the heating step (i.e., heating step included in the electronic device formation step), which takes long hours and is performed after adhesion (temporary bonding) of the adhesive layer 12.

Based on this finding, in the adhesive characteristics adjustment step according to the present embodiment, the adhesive characteristics of the adhesive layer 12 are adjusted to satisfy the relationship of $P_B < P_A$. $P_A$ denotes the peel strength of the adhesive layer 12 during the period after the electronic device formation step and before the separation step, in the case where the adhesive layer 12 undergoes the electronic device formation step without undergoing the adhesive characteristics adjustment step. $P_B$ denotes the peel strength of the adhesive layer 12 during the period after the electronic device formation step and before the separation step, in the case where the adhesive layer 12 undergoes the electronic device formation step after undergoing the adhesive characteristics adjustment step.

That is, in the adhesive characteristics adjustment step, adjustment is made such that the peel strength of the adhesive layer 12 after the electronic device formation step is reduced as compared to when the adhesive layer 12 does not undergo the adhesive characteristics adjustment step. In this way, even when the adhesive layer 12 undergoes the electronic device formation step, the peel strength of the adhesive layer 12 is prevented from being excessively increased. This avoids problems that may arise when the flexible substrate 13 is separated from the supporting substrate 11 during the separation step (FIG. 1E), such as that the flexible substrate 13 is damaged during the separation, and that the flexible substrate 13 cannot be separated from the supporting substrate 11.

<1. Method by Heating Process>

(Conditions of Heating Process and Peel Strength Measurement Test)

FIG. 2 is a table showing (i) a heating condition during the adhesive characteristics adjustment step and (ii) the peel strength of an adhesive layer at a predetermined time point. The peel strength measurement test was conducted based on the following procedures. The peel strength measurement test was conducted according to Japanese Industrial Standard JIS K6854-1.

In entry 1, after an adhesive layer was formed over a glass substrate, a peel strength (X) of the adhesive layer was measured without performing a heating process. Thereafter, a flexible substrate for the experiment was temporarily bonded to the glass substrate over which the adhesive layer was formed. Subsequently, a heating step was performed on a structure composed of the glass substrate, the adhesive layer, and the flexible substrate, and the structure was heated for eight hours at a heating temperature of 210° C. This heating step was assumed to be included in the electronic device formation step. Hereinafter, the heating step of heating the structure for eight hours at a heating temperature of 210° C. is referred to as "heating step assumingly included in the electronic device formation step". After completion of the heating step assumingly included in the electronic device formation step, a peel strength (Y) of the adhesive layer was measured, which is a peel strength at the time the flexible substrate for the experiment was separated from the glass substrate.

In each of entry 2 to entry 6, a glass substrate over which an adhesive layer was formed was subjected to a heating process. The heating process in each entry was performed based on the heating temperature and the heating duration shown in the table of FIG. 2. After the heating process, the peel strength (X) of the adhesive layer was measured. Thereafter, a flexible substrate for the experiment was temporarily bonded to the glass substrate over which the adhesive layer was formed. Subsequently, the heating step assumingly included in the electronic device formation step was performed on a structure composed of the glass substrate, the adhesive layer, and the flexible substrate. After completion of the heating step assumingly included in the electronic device formation step, the peel strength (Y) at the time the flexible substrate for the experiment was separated from the glass substrate was measured.

The peel strengths (X) and (Y) in each of entry 1 to entry 6 are as shown in the table of FIG. 2. The numerical values of the respective peel strengths in the table of FIG. 2 are relative values when the peel strength (Y) in entry 1 is taken as 100.

Note that in entry 1, a heating process is not performed. Accordingly, the peel strength (X) "after heating process" in entry 1 is the peel strength of the adhesive layer measured during a period after the formation of the adhesive layer and before the heating step assumingly included in the electronic device formation step. Also, the peel strength (X) "after heating process" in each of entry 2 to entry 6 is the peel strength of the adhesive layer measured during a period after the heating process and before the heating step assumingly included in the electronic device formation step.

The peel strength (Y) "after heating step (210° C., 8 hrs)" in each of entry 1 to entry 6 is the peel strength of the adhesive layer measured after completion of the heating step assumingly included in the electronic device formation step. Since the heating process is not performed in entry 1, the peel strength (Y) in entry 1 is equivalent to the peel strength $P_A$ described above. Since the heating process is performed in each of entry 2 to entry 6, the peel strength (Y) in each of entry 2 to entry 6 is equivalent to the peel strength $P_B$ described above.

As compared to entry 1 which does not involve the heating process, the peel strength (X) of the adhesive layer is reduced to less than one-fifth in entry 2 to entry 6 which each involve the heating process. This is considered to be caused by a surface of the adhesive layer being cured by the heating process, as described above.

Regardless of whether the heating process was performed or not, an increase was observed in the peel strength (Y) as compared to the peel strength (X) in every entry. This is due to a general property of a silicone adhesive. However, in each of entry 2 to entry 6, the peel strength after completion of the heating step assumingly included in the electronic device formation step is reduced by more than 20% as compared to entry 1. This is because each of entry 2 to entry 6 includes a heating process performed at a temperature of 200° C. or higher.

Note that the peel strength (X) in each of entry 5 and entry 6 is 1.5, which is the least peel strength among all entries. The present inventors have confirmed that this value, 1.5, is equal to or larger than the peel strength required in order to form an OLED device and an organic TFT during the electronic device formation step.

Based on the above measurement test, the heating conditions shown in entry 2 to entry 6 are intended as the conditions in the present embodiment. That is, in the present embodiment, the minimum heating temperature is set to 200° C., and the minimum heating duration is set to one hour. Note that the silicone adhesive starts being decomposed when being heated at a temperature higher than 300° C. Accordingly, the maximum heating temperature in the present embodiment is 300° C. Furthermore, entry 5 differs from entry 6 with respect to the heating duration. However, as shown in FIG. 2, although the heating duration is changed from one hour to three hours, the peel strengths (X) and (Y) were the same between entry 5 and entry 6. Accordingly, the maximum heating duration in the present embodiment is three hours.

To summarize the above, the heating temperature for the heating process in the present embodiment is 200° C. to 300° C., and the heating duration is one hour to three hours.

Furthermore, in entry 1 to entry 6 in FIG. 2, the focus is placed on the difference between the peel strengths (X) and (Y), i.e., on the difference between before and after the heating step assumingly included in the electronic device formation step. Specifically, the difference is 54 in entry 1; 69 in entry 2; 55.5 in entry 3; 41 in entry 4; 10 in entry 5; and 10 in entry 6. Based on the above, it can be seen that an increase in the peel strength due to the heating step assumingly included in the electronic device formation step is reduced in entry 4 to entry 6 as compared to entry 1, where in entry 4 to entry 6, a heating process was performed at a heating temperature of 250° C. or higher, and in entry 1, a heating process was not performed. Accordingly, with the heating process as described above, an increase in the peel strength of the adhesive layer caused by the electronic device formation step is further reduced.

In other words, a more beneficial heating temperature for the heating process in the present embodiment is 250° C. to 300° C.

The following is the conceivable reason why the heating process reduces an increase in the peel strength caused by the heating step assumingly included in the electronic device formation step.

First, suppose that the adhesive layer is attached to the flexible substrate without the adhesive layer undergoing the heating process (entry 1), i.e., that the adhesive layer is attached to the flexible substrate without a surface of the adhesive layer being cured. In this case, a soft adhesive at the surface of the adhesive layer enters into microscopic asperities at a surface of the flexible substrate. If the adhesive layer is heated for long hours in the above state, the adhesive layer is cured with the adhesive being penetrated in the asperities at the surface of the flexible substrate. This is considered to increase the adhesion between the surface of the adhesive layer and the surface of the flexible substrate, causing an excessive increase in the peel strength.

On the other hand, suppose that the adhesive layer is attached to the flexible substrate after the adhesive layer undergoing the heating process (entry 2 to entry 6). In this case, since the surface of the adhesive layer is cured, the adhesive at the surface of the adhesive layer does not easily enter the microscopic asperities at the surface of the flexible substrate. Since the adhesive at the surface of the adhesive layer is less likely to be penetrated in the asperities at the surface of the flexible substrate, the adhesion between the surface of the adhesive layer and the surface of the flexible substrate is considered not to increase significantly even when the adhesive layer is heated for long hours, thus reducing an increase in the peel strength.

(Curing Reaction at Surface of Adhesive Layer during Heating Process)

Figure 3B:
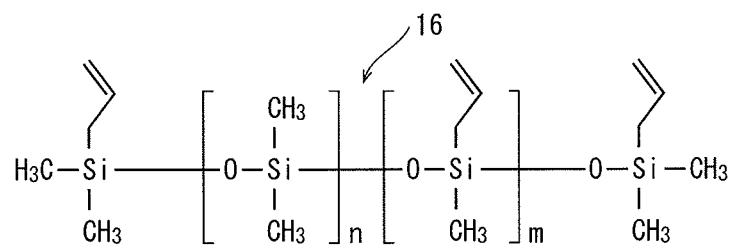
FIG. 3B shows the structure of a vinyl group-containing silicone 16.

An addition-cure silicone adhesive generally includes an Si—H group-containing silicone and a vinyl group-containing silicone. FIG. 3A shows the structure of an Si—H group-containing silicone 15, and FIG. 3B shows the structure of a vinyl group-containing silicone 16. Note that the polymerization degree "n" in FIG. 3A may not necessarily be the same as the polymerization degree "n" in FIG. 3B. Similarly, the polymerization degree "m" in FIG. 3A may not necessarily be the same as the polymerization degree "m" in FIG. 3B.

Figure 3C:
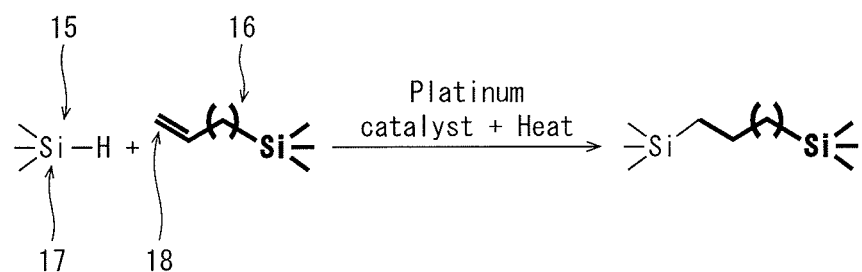
FIG. 3C shows a reaction formula when the adhesive layer is cured in the adhesive characteristics adjustment step (heating process).

FIG. 3C shows a reaction formula when the adhesive layer is cured in the adhesive characteristics adjustment step (heating process). This curing reaction is a well-known reaction that proceeds by a platinum catalyst (curing agent) and heat. Specifically, an Si—H bond 17 of the Si—H group-containing silicone 15 is added to a terminal olefin 18 of the vinyl group-containing silicone 16.

<2. Method by UV Irradiation Process>

(Conditions of UV Irradiation Process and Peel Strength Measurement Test)

FIG. 4 is a table showing (i) a UV irradiation condition during the adhesive characteristics adjustment step and (ii) the peel strength of the adhesive layer at a predetermined time point. The peel strength measurement test was performed based on the following procedures.

Entry 1 in FIG. 4 is the same as entry 1 in FIG. 2. In each of entry 2 and entry 3, a glass substrate over which an adhesive layer was formed was subjected to a UV irradiation process. The UV irradiation process was performed based on the light source used and the irradiation duration shown in the table of FIG. 4. After the UV irradiation process, the peel strength (X) was measured. Thereafter, a flexible substrate for the experiment was temporarily bonded to the glass substrate over which the adhesive layer was formed. Subsequently, a heating step was performed on a structure composed of the glass substrate, the adhesive layer, and the flexible substrate. This heating step is a heating step assumingly included in the electronic device formation step (i.e., step of heating the structure for eight hours at a heating temperature of 210° C.), similarly to the case of the method by the heating process. After completion of the heating step assumingly included in the electronic device formation step, a peel strength (Y) of the adhesive layer was measured, which is a peel strength at the time the flexible substrate for the experiment was separated from the glass substrate. In the "light source used" in FIG. 4, light sources used for the experiment are shown together with the wavelengths thereof in parentheses.

The peel strengths (X) and (Y) in each of entry 1 to entry 3 are as shown in the table of FIG. 4. Similarly to FIG. 2, the numerical values of the respective peel strengths in the table of FIG. 4 are relative values when the peel strength (Y) in entry 1 is taken as 100.

The peel strength (X) "after UV irradiation process" in entry 1 is the peel strength of the adhesive layer measured during a period after the formation of the adhesive layer and before the heating step assumingly included in the electronic device formation step. Also, the peel strength (X) "after UV irradiation process" in each of entry 2 and entry 3 is the peel strength of the adhesive layer measured during a period after the UV irradiation process and before the heating step assumingly included in the electronic device formation step.

The peel strength (Y) "after heating step (210° C., 8 hrs)" in each of entry 1 to entry 3 is the peel strength of the adhesive layer measured after completion of the heating step assumingly included in the electronic device formation step. In FIG. 4, the peel strength (Y) in entry 1 is equivalent to the peel strength $P_A$, and the peel strength (Y) in each of entry 2 and entry 3 is equivalent to the peel strength $P_B$.

As compared to entry 1 which does not involve the UV irradiation process, the peel strength (X) of the adhesive layer is reduced to approximately one-eighth in entry 2 and entry 3 which each involve the UV irradiation process. This is considered to be caused by a surface of the adhesive layer being cured by the UV irradiation process.

Similarly to FIG. 2, an increase was observed in the peel strength (Y) as compared to the peel strength (X) in every entry. However, in each of entry 2 and entry 3, the peel strength after the heating step assumingly included in the electronic device formation step is reduced to less than one-fifth as compared to entry 1. This is because each of entry 2 and entry 3 includes a UV irradiation process.

The results shown in FIG. 4 indicate that irradiation with UV rays in the wavelength band of 150 nm to 380 nm can reduce the peel strength of the adhesive layer that has undergone the heating step assumingly included in the electronic device formation step, as compared to the case of not performing the UV irradiation process. Accordingly, performing a UV irradiation process as the adhesive characteristics adjustment step can produce the same effect as performing the heating process.

(Curing Reaction Presumed to Occur in UV Irradiation Process)

First, when the Si—H group-containing silicone 15 (FIG. 3A) is irradiated with UV rays, it is speculated that a cleavage occurs between a silicon atom and a hydrogen atom in an Si—H group to cause a silyl radical. This silyl radical can be added to a terminal carbon atom of a vinyl group in the vinyl group-containing silicone 16 (FIG. 3B) to produce an alkyl radical. This alkyl radical abstracts a hydrogen atom of another Si—H group, which causes a silyl radical again. An addition reaction (curing reaction) is considered to progress as a result of a radical reaction as described above occurring repeatedly.

In the case of the adhesive characteristics adjustment step based on the UV irradiation process, a curing agent (platinum catalyst) is considered not essential to cure the surface of the adhesive layer. The UV irradiation process per se can cause progression of the addition reaction between the Si—H group-containing silicone 15 and the vinyl group-containing silicone 16.

(UV Irradiation Duration)

Concerning the UV irradiation duration in the UV irradiation process, if excimer UV rays (172 nm) are used as a light source, it is beneficial that the UV irradiation duration is 0.1 to 60 seconds. When the irradiation duration was shorter than 0.1 seconds, the peel strength of the adhesive layer did not decrease after the UV irradiation process, i.e., a curing reaction did not progress at the surface of the adhesive layer. This is presumably because, if the irradiation duration is too short, a silyl radical is less likely to occur. On the other hand, if the irradiation duration exceeds 60 seconds, a crack was observed in the adhesive layer. This is presumably because a great number of silyl radicals were generated to cause rapid curing reaction at the surface of the adhesive layer.

On the other hand, if a high pressure mercury lamp (254 nm or 365 nm) is used as a light source, it is beneficial that the UV irradiation duration is five minutes to ten minutes. When the irradiation duration was shorter than five minutes, the peel strength of the adhesive layer did not decrease after the UV irradiation process. The maximum irradiation duration is set to 10 minutes in view of the manufacturing efficiency.

[Modifications and Other Considerations]

Although the present disclosure has been described based on an embodiment thereof, the present disclosure is not limited to the above embodiment. For example, the following modifications are acceptable.

(1) According to the above embodiment, the adhesive layer is formed over the supporting substrate. However, the present disclosure is not limited to such. In the present disclosure, the adhesive layer may be formed over at least one of the supporting substrate and the flexible substrate. For example, the adhesive layer may be formed over the flexible substrate, and the flexible substrate over which the adhesive layer has been formed may be laminated to the supporting substrate. Also, one adhesive layer may be formed over the supporting substrate, and another over the supporting substrate. Then, these substrates, over each of which the adhesive layer has been formed, may be laminated to each other.

The advantages of forming the adhesive layer over the supporting substrate are as follows. In the case where the adhesive layer is formed over the flexible substrate, the flexible substrate is placed on a workbench or the like, in the state where (i) a surface of the flexible substrate over which the electronic device layer is to be formed faces downwards and (ii) a surface of the flexible substrate opposite the surface of the flexible substrate over which the electronic device layer is to be formed faces upwards. At this time, dirt or the like on the workbench is attached to the surface over which the electronic device layer is to be formed to cause problems. Also, in the case where the adhesive layer is formed over the flexible substrate, there is a possibility that when a remnant of the adhesive layer is removed from the flexible substrate in the adhesive layer removal step, the electronic device layer may be damaged. However, such problems do not occur in the case where the adhesive layer is formed over the supporting substrate.

Concerning the problem of dirt being attached to a surface of the flexible substrate over which the electronic device layer is to be formed, this problem can be avoided by applying a heat-resistant protective sheet or the like to the surface of the flexible substrate over which the electronic device layer is to be formed.

(2) In the above embodiment, the electronic device formation step includes the OLED device formation step and the organic TFT formation step. However, the present disclosure is not limited to such. For example, the electronic device formation step may include only one of the OLED device formation step and the organic TFT formation step. Alternatively, the electronic device formation step may include a step differing from these steps. Also, in the above embodiment, the organic TFT and the OLED device are taken as examples of the electronic devices. However, the present disclosure is not limited to such. Other examples of the electronic devices include an oxide TFT, an amorphous silicon TFT, and a polysilicon TFT.

(3) In the above embodiment, the heating step in the electronic device formation step is a factor for an increase in the peel strength. However, this is merely an example, and the heating step is not the only factor for an increase in the peel strength.

(4) The adhesive layer may be formed with an adhesive other than the silicone adhesive described in the above embodiment. For example, the adhesive layer may be formed with an acrylic adhesive, a polyolefin adhesive, or a polyvinyl carbamate adhesive. Also, in the adhesive layer formation step, the adhesive layer may be formed by, for example, application of an adhesive or attachment of an adhesive sheet.

(5) The adhesive layer formation step shown in FIG. 1A includes a step of heating the adhesive layer 12 in order to evaporate a solvent contained in the silicone adhesive (the solvent being toluene in the case of the silicone adhesive in the above embodiment). However, this heating step is a step necessary to form the adhesive layer. In other words, this heating step is a step included in the adhesive layer formation step, and not included in the heating process during the adhesive characteristics adjustment step.

(6) In the above embodiment, the description is focused on curing the surface of the adhesive layer. However, in practice, a curing reaction is considered to progress not only at the surface of the adhesive layer but also inside the adhesive layer.

(7) The manufacturing method of an OLED device described in the above embodiment is merely an example. The method may further include a step of forming another constituent element. Also, according to the above embodiment, a description is provided of the manufacturing method of an OLED device in which light is extracted from the cathode side. However, the present disclosure is not limited to such. For example, it is possible, instead, to employ a manufacturing method of an OLED device of a different type, such as an OLED device in which light is extracted from the anode side or an OLED device in which light is extracted from both the anode side and the cathode side.

(8) The materials, numerical values, etc., used in the embodiment above are merely examples, and no limitations are intended thereby. Also, appropriate modifications can be made to the above embodiment provided that these do not deviate from the technical concept of the present disclosure. Furthermore, members in the accompanying drawings are not depicted to scale. Note that a numerical range stated as " . . . to . . . " is intended to mean that the upper and lower limits are both inclusive.

INDUSTRIAL APPLICABILITY

The manufacturing method of a flexible device according to the present disclosure can be favorably used to manufacture a flexible device that constitutes a display or the like mounted in a portable information terminal or the like.

REFERENCE SIGNS LIST 10 flexible device
11 supporting substrate
12 adhesive layer
13 flexible substrate
14 electronic device layer
15 Si—H group-containing silicone
16 vinyl group-containing silicone

The invention claimed is:

1. A manufacturing method of a flexible device, comprising:
    forming an adhesive layer containing a thermosetting material over at least one of a flexible substrate and a supporting substrate;
    adjusting adhesive characteristics of the adhesive layer by heating the adhesive layer for one hour to three hours at 200° C. to 300° C., after forming the adhesive layer;
    temporarily bonding the supporting substrate and the flexible substrate with the adhesive layer therebetween, after adjusting the adhesive characteristics of the adhesive layer;
    forming one or more electronic devices over a surface of the flexible substrate opposite a surface thereof that faces the adhesive layer, after temporarily bonding the supporting substrate and the flexible substrate; and
    separating the flexible substrate from the supporting substrate, after forming the electronic devices, wherein the forming one or more electronic devices comprises heating that hardens the thermosetting material.

2. The manufacturing method of claim 1, wherein the adhesive layer is formed over the supporting substrate.

3. The manufacturing method of claim 1, wherein the adhesive layer includes a silicone adhesive.

4. The manufacturing method of claim 3, wherein the silicone adhesive has a vinyl group.

5. The manufacturing method of claim 1, wherein the adhesive layer is subjected to heat during the formation of the electronic devices.

6. The manufacturing method of claim 5, wherein during the formation of the electronic devices, the adhesive layer is subjected to heat at a heating temperature of 200° C. to 280° C. for a total heating duration of one hour to fifteen hours.

7. The manufacturing method of claim 6, wherein the electronic devices include at least one of an organic thin film transistor and an OLED device.

8. The manufacturing method of claim 1, further comprising
    removing a remnant of the adhesive layer formed over the supporting substrate after separating the flexible substrate from the supporting substrate.

9. The manufacturing method of claim 1, wherein the adjusting the adhesive characteristics of the adhesive layer comprises heating the adhesive layer is 250° C. to 300° C., after forming the adhesive layer.

10. The manufacturing method of claim 9, wherein the adjusting the adhesive characteristics of the adhesive layer comprises heating the adhesive layer is 250° C. to 280° C., after forming the adhesive layer.

* * * * *